United States Patent
Tran et al.

(10) Patent No.: US 7,839,682 B2
(45) Date of Patent: Nov. 23, 2010

(54) ARRAY AND PITCH OF NON-VOLATILE MEMORY CELLS

(75) Inventors: Hieu Van Tran, San Jose, CA (US); Anh Ly, San Jose, CA (US); Hung Q. Nguyen, Fremont, CA (US); Thuan T. Vu, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 130 days.

(21) Appl. No.: 12/362,106

(22) Filed: Jan. 29, 2009

(65) Prior Publication Data

US 2010/0188900 A1 Jul. 29, 2010

(51) Int. Cl.
    *G11C 16/00* (2006.01)
(52) U.S. Cl. .................. 365/185.05; 365/185.02; 365/185.11; 365/185.23
(58) Field of Classification Search .......... 365/185.02
    See application file for complete search history.

(56) References Cited

U.S. PATENT DOCUMENTS 5,270,979 A * 12/1993 Harari et al. .......... 365/185.09
5,761,119 A * 6/1998 Asano .................... 365/185.14
7,567,458 B2 * 7/2009 Tran et al. .............. 365/185.15

* cited by examiner

*Primary Examiner*—Tan T. Nguyen
(74) *Attorney, Agent, or Firm*—DLA Piper LLP (US)

(57) ABSTRACT

An array of non-volatile memory cells is arranged in a plurality of rows and columns, wherein each memory cell has at least three terminals: a first terminal for the read out of the signal from the memory cell, a second terminal to which high voltage is supplied during certain operation, and a third terminal to which low voltage is supplied in all operations. The cells in the same column have a common bit line connected to the first terminal of memory cells in the same column. The array comprises a first and second sub arrays of memory cells arranged adjacent to one another in the same row. A first decoder is positioned to one side of the first sub array in the same row as the first sub array. A second decoder is positioned to another side of the second sub array in the same row as the second sub array. A first high voltage line is connected to the second decoder and to only the second terminal of the memory cells in the same row in the first sub array. A second high voltage line, different from the first high voltage line, is connected to the second decoder and to only the second terminal of the memory cells in the same row in the second sub array. A low voltage line is connected to the first decoder and to the thirds terminal of the memory cells in the same row of the first and second sub arrays.

31 Claims, 14 Drawing Sheets

ARRAY AND PITCH OF NON-VOLATILE MEMORY CELLS

TECHNICAL FIELD

The present invention relates to a non-volatile memory array and pitch design which minimizes voltage drop across the array, and more particularly the present invention relates to a memory array and pitch design which optimizes the distribution of high voltages and creates small sectors.

BACKGROUND OF THE INVENTION

Non-volatile memory cells and array are well known in the art. Typically, in operation a non-volatile memory cell/array requires that low voltage and high voltage be supplied to the cell/array, for certain operations. Further, it is well known that memory cells are arranged in an array of a plurality of rows and columns, with cells in the same column being connected to the same bit line to one or more sense amplifiers. Cells in the same row share certain common lines such as word line and/or erase lines. As processing technology permits further scaling more and more cells are connected in the same row, creating sectors with larger number of cells connected to the same row line. Thus, as scaling increases, sector size also increases. This poses a problem in that as more cells are connected to a common row line, the voltage drop across that row line from the point where the first memory cell is connected to the row line to the last memory cell connected to that same row line would increase. This creates potential error problems.

Referring to FIG. 1 there is shown a schematic cross-sectional view of a non-volatile memory cell 10 of the prior art which can be used to form a non-volatile memory array of the present invention, although as will be seen, the present invention is not limited to the memory cell of the type shown in FIG. 1. The memory cell 10 comprises a substrate 12 of a semiconductor material of a first conductivity type, such as P type. A first region 14 (drain region or BL) of a second conductivity type, such as N, is along the surface of the substrate 12. Spaced apart from the first region 14 is a second region 16 (source region or SL) also of the second conductivity type. Between the first region 14 and the second region 16 is a channel region 18. As is well known, charges travel the channel region 18 from one region 14 or 16 to the other region 16 or 14. A bit line typically connects to the first region 14. Cells in the same column in the array have the same bit line connected in common.

A word gate or WL 20 is insulated from the channel region 18 and is over a portion of the channel region 18. A floating gate 22 is adjacent to the word gate 20 and is insulated therefrom and is over another portion of the channel region 18. A control gate (also known as coupling gate) or CG 24 is over the floating gate and is capacitively coupled thereto. Finally, an erase gate or EG 26 is adjacent to the floating gate 22 to another side of the floating gate 22 and is insulated therefrom. The erase gate 26 is also over the source region 16 and is insulated therefrom.

In certain operations of the memory cell 10, low voltages are applied. For example, during a read operation, low voltages are applied to the word gate 20, the coupling gate 24, and the source region 16. In other operations, high voltages are applied. For example, during erase operation, high voltage is applied to the erase gate 26. Yet in other operations, both low voltage and high voltages are applied simultaneously. Thus, during programming, low voltage is applied to the word gate 20, while high voltage is applied to the control gate 24 and to the source region 16.

Referring to FIG. 1A there is shown a non-volatile memory array and pitch 30 of the prior art as an example. An array 31 consists of 4096 (4K) columns and 2048 (2K) rows of memory cells. Each memory cell has five terminals (BL, WL, CG, EG, SL coupled to (bitline) drain region 14, word gate 20, control gate 24, erase gate 26, and source region 16 respectively) as described above. The array 31 is organized as a plurality of sectors. Each sector, for example, consists of 8 rows and 4096 columns, making up a total of 4 KB (4096 bytes). All memory cells in a 4 KB sector are erased at same time and may be programmed at different times. This small sector size of 4 KB is needed for typical microcontroller system application for handling small size of data (such as system configuration data, date, time, tags, manufacturing ID, product ID, security code, etc). Within each sector there are 8 poly lines of word-lines WL<0:7>, 4 poly lines of erase gate EGs (since each erase gate EG is shared between two neighboring top and bottom cells), 8 poly lines of control gates CGs, 4 diffusion lines of source-lines SLs (since each diffusion source line SL is shared between two neighboring cells). These poly lines or diffusion lines may be segmented at certain intervals to make room for metal lines to strap to those poly or diffusion segments so as to reduce time delay or voltage drop across the array 31. Since all cells in a sector are erased together, all 4 poly erase gates are connected together to form electrically one erase gate per 4 KB sector (that consists of 8 rows and 4K bitlines of memory cells). Also typically all 8 poly control gates are connected together to form electrically one control gate or two control gates per sector. Also all 4 diffusion source lines are connected together to form electrically one source line per sector. Alternative sector size organization is possible such as 8 KB sector size which might consists of 16 rows and 4K bitlines or of 8 rows and 8K bitlines, or such as 16 KB sector size which might consists of 16 rows and 8K bitlines or of 32 rows and 4K bitlines. Alternative sector size such as 32 KB or greater is possible.

With each array 31 there is an associated a first decoder (XDEC) 32 and a second decoder (WSHDRV) 34. A memory chip may include a plurality of arrays 31 and decoders 32 and 34. Not shown is y-decoder (column decoder) which provides the column (bitline BL) selection. The first decoder 32 provides selection for wordline WLs for 2048 rows of memory cells. The second decoder 34 provides selection for the control gates CGs, erase gate EGs, and source-line SLs for 2048 rows of memory cells. The first decoder 32 includes a plurality of decoder 42 (described below). Each decoder 42 is used for an array sector (8 rows). The second decoder 34 includes a plurality of decoders 44 (described below). Each decoder 44 is used for an array sector (8 rows).

Referring to FIG. 1B there is shown another prior art non-volatile memory array 41 with decoders 42 and 44 as an example of 4 KB sector array and its associated decoders. Each sector is shown with 8 (strapping) metal-line wordline WL<0:7> (coupled to the word gate 20 of memory cells), one (strapping) metal-line control gate CG<0> (coupled to control gate 24 of memory cells), one (strapping) metal-line erase gate EG<0> (coupled to erase gate 26 of memory cells), and one (strapping) metal-line source line SL<0> (coupled to source region 16 of memory cells) and 4K bitlines (columns (BL0 to BL4096) coupled to bitline (drain) region 14 of memory cells). NMOS transistor 46A and 46B are used to pull the source line SL<0> to virtual ground, e.g. around zero volt, in read condition. Operating condition for such array is shown in the following Table 1.

TABLE 1

Operating Array Conditions (in volts)

| | Erase | Program | Read |
|---|---|---|---|
| Selected Sector | | | |
| Selected WL (1/8 WLs selected) | 0 | Vwlprog | Vwlrd |
| Unselected WL (7/8 WLs unselected) | 0 | 0 | 0 |
| EG0 | Veger | 0/Vegprog | 0/Vegrd |
| CG0 | 0 | Vcgprog | Vcgrd |
| SL0 | 0 | Vslprog | 0 |
| Unselected Sectors | | | |
| EGs | 0 | 0 | 0/Vegrd |
| CGs | 0/Vcgrd | 0/Vcgrd | 0/Vcgrd |
| SLs | 0 | VUNSELprog | 0 |
| Selected BL | 0 | Iprog | Vrdbl |
| Unselected BLs | 0 | VINH | 0 |

Where exemplary voltages and currents are as follows:

| Vwlrd | 1.2-2.5 v | Word line read bias |
|---|---|---|
| Vcgrd | 1.2-2.5 v | Control gate read bias |
| Vegrd | 1.2-2.5 v | Erase gate read bias |
| Vblrd | 0.3-1.6 v | Bitline read bias |
| Veger | 8.0-12.0 v | Erase gate erase voltage |
| Vslprog | 3.5-5.0 v | Source line program voltage |
| Vunslprog | 0.0-2.0 v | Unselected source line program voltage |
| Vwlprog | 0.8-1.8 v | Word line program voltage |
| Vcgprog | 8.0-12.0 v | Control gate program voltage |
| Vegprog | 3.5-5.0 v | Erase gate program voltage |
| Iprog | 0.1-10 uA | Program current bias |
| VINH | 1.2-2.5 v | Inhibit voltage on unselected bitline |

In the embodiment shown in FIGS. 1A and 1B and in the figures set forth herein, bitlines BL0-BLN are in metal1, wordlines WL0-N, CGs, EGs, are in (strapping) metal2, and source lines SLs are in (strapping) metal3. Metal material can be Tungsten, Aluminum, Copper or any other conductive material. Alternatively different number, such as 4-7 metal layers, or different arrangements of strapping metal layers, such as changing vertical and horizontal directions of the strapping metal layers, can be used. Via layers are used to strap metal layers to poly or diffusion layer of memory cells and are not shown (called array metal strapping). Array metal strapping frequency (how frequent, i.e. strapping per how many bitlines, metal layer making contact to poly or diffusion layer of memory cells) is typically more frequent for source line and wordline and less frequent for control gate and erase gate.

Referring to FIG. 1C there is shown a schematic circuit diagram of the non-volatile memory array 41 shown in FIG. 1B. As shown symbolically is a schematic of two memory arrays 41 (41A and 41B) with each array 41 consisting of 8 rows and 4K bitlines making up a 4 KB array sector. The 4 KB sector thus consists of 8 WLs, 1 CG, 1 SL, and 1 EG. Top (horizontal) metal strapping layers are not shown for clarification purpose. Vertical metal strap line 43 is shown per sector for connecting 4 poly erase gates into one EG, 4 diffusion source lines into one SL, 8 poly control gates into one CG (not shown for WL). Strap for EG, SL, CG is shown to be next to each other at one physical place. Strapping frequency (how often the top metal connect through via to poly or diffusion layer of memory cells) is not shown. Typical strapping frequency for SL or WL is per 8, 16, 32 memory cells and for EG or CG is less frequent than that of SL or WL.

The problem is that as scaling increases, the memory cell area is reduced at a greater ratio than the pitch circuitry (meaning the decoders 32/42 and 34/44) causing the decoder area overheads to be significant portion of the die-size. One reason the decoder area is not reduced in the same ratio as the scaling ratio is that the operating voltage condition for non-volatile erase and program operation remains very high. Hence an innovation is needed to reduce the pitch decoder overhead, especially to maintain the same small sector size without degrading the electrical performance such as disturb in programming. Another challenge is that as the size of various features is reduced, the electrical parasitic such as source line diffusion resistance increases. This causes greater voltage drops, in low voltage as well as in high voltage condition, from one end of a row line to another end, for voltages that are applied to that row line.

It is therefore, desirable to decrease the variation in the voltage drop in a row line.

SUMMARY OF THE INVENTION

An array of non-volatile memory cells is arranged in a plurality of rows and columns, wherein each memory cell has at least three terminals: a first terminal for the read out of the signal from the memory cell, a second terminal to which high voltage is supplied during certain operation, and a third terminal to which low voltage is supplied in all operations. The cells in the same column have a common bit line connected to the first terminal of memory cells in the same column. The array comprises a first and second sub arrays of memory cells arranged adjacent to one another in the same row. A first decoder is positioned to one side of the first sub array in the same row as the first sub array. A second decoder is positioned to another side of the second sub array in the same row as the second sub array. A first high voltage line is connected to the second decoder and to only the second terminal of the memory cells in the same row in the first sub array. A second high voltage line, different from the first high voltage line, is connected to the second decoder and to only the second terminal of the memory cells in the same row in the second sub array. A low voltage line is connected to the first decoder and to the third terminal of the memory cells in the same row of the first and second sub arrays.

DETAILED DESCRIPTION OF THE INVENTION

Figure 1:
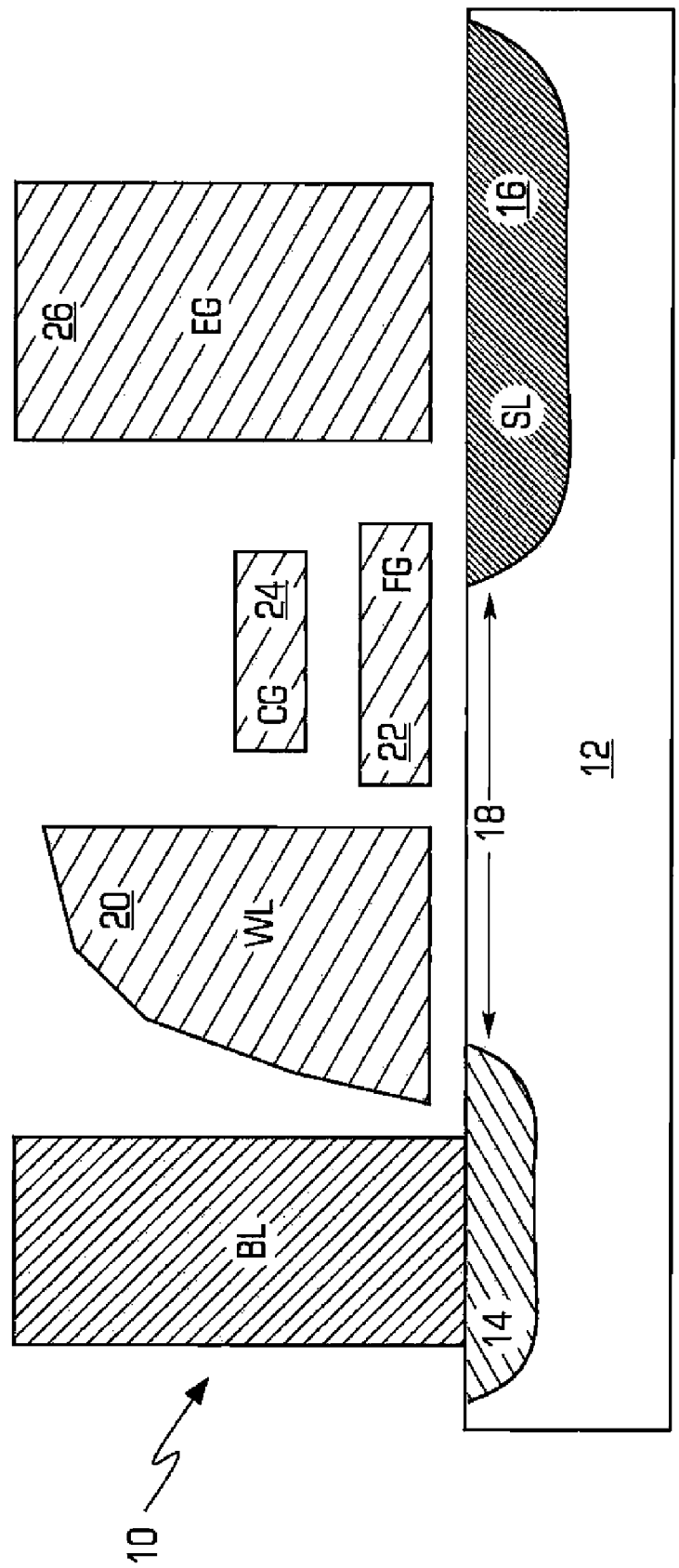
FIG. 1 is a cross sectional view of a non-volatile memory cell of the prior art which can be used in the memory array of the present invention.
Figure 1A:
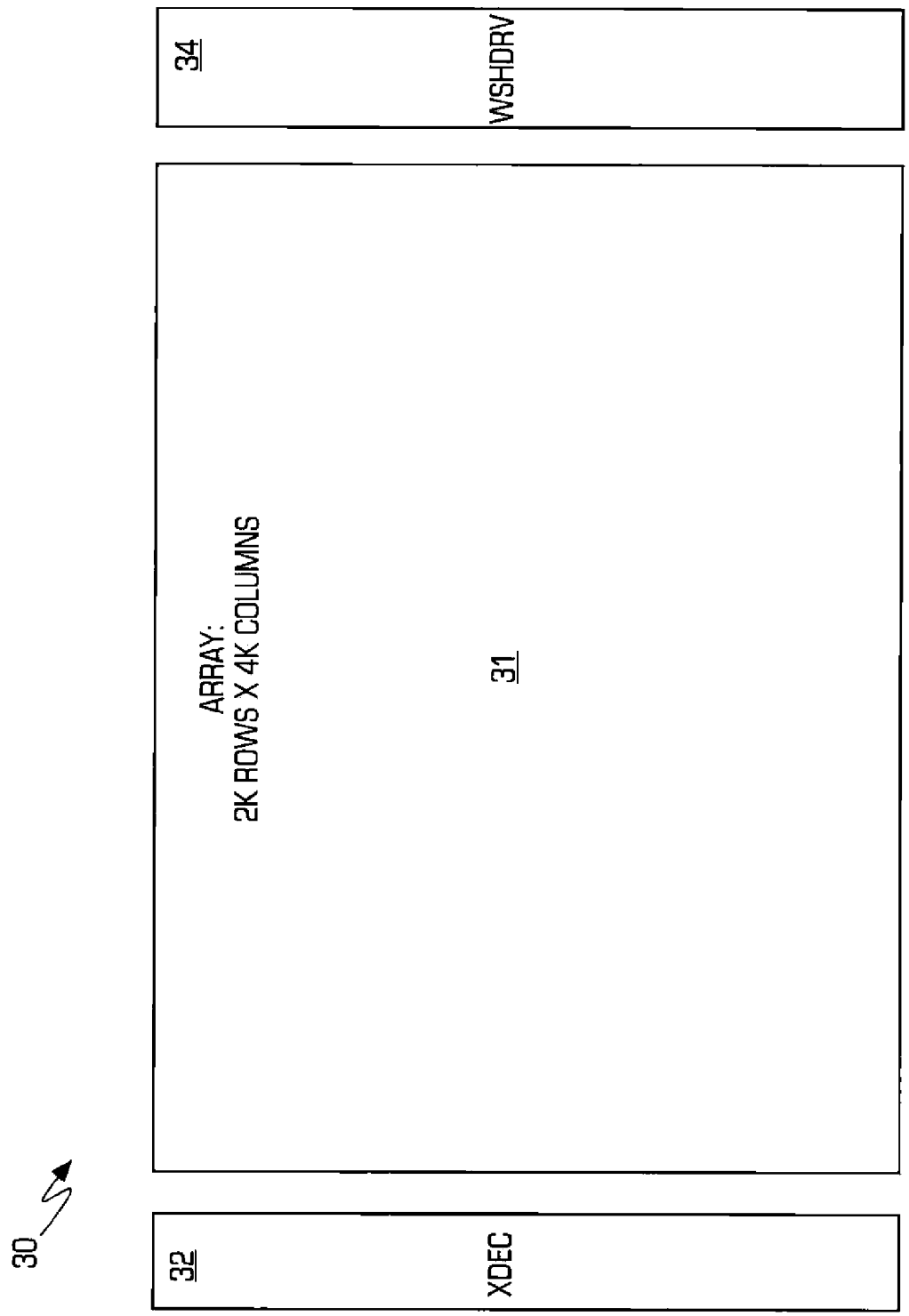
FIG. 1A is a block diagram of a non-volatile memory array of the prior art using the non-volatile memory cell of FIG. 1.
Figure 1B:
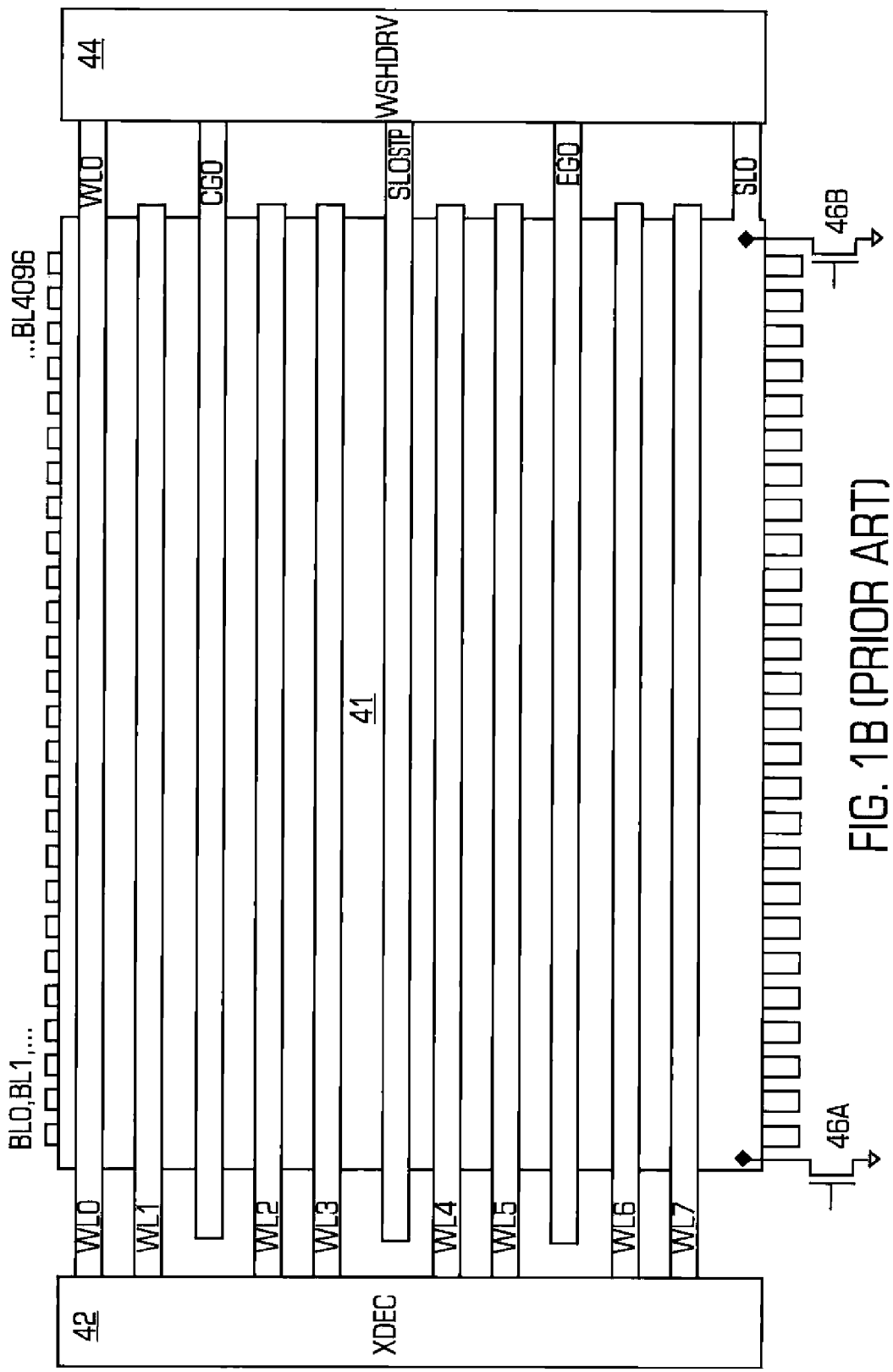
FIG. 1B is a block diagram of a non-volatile memory array of the prior art using the non-volatile memory cell of FIG. 1.
Figure 1C:
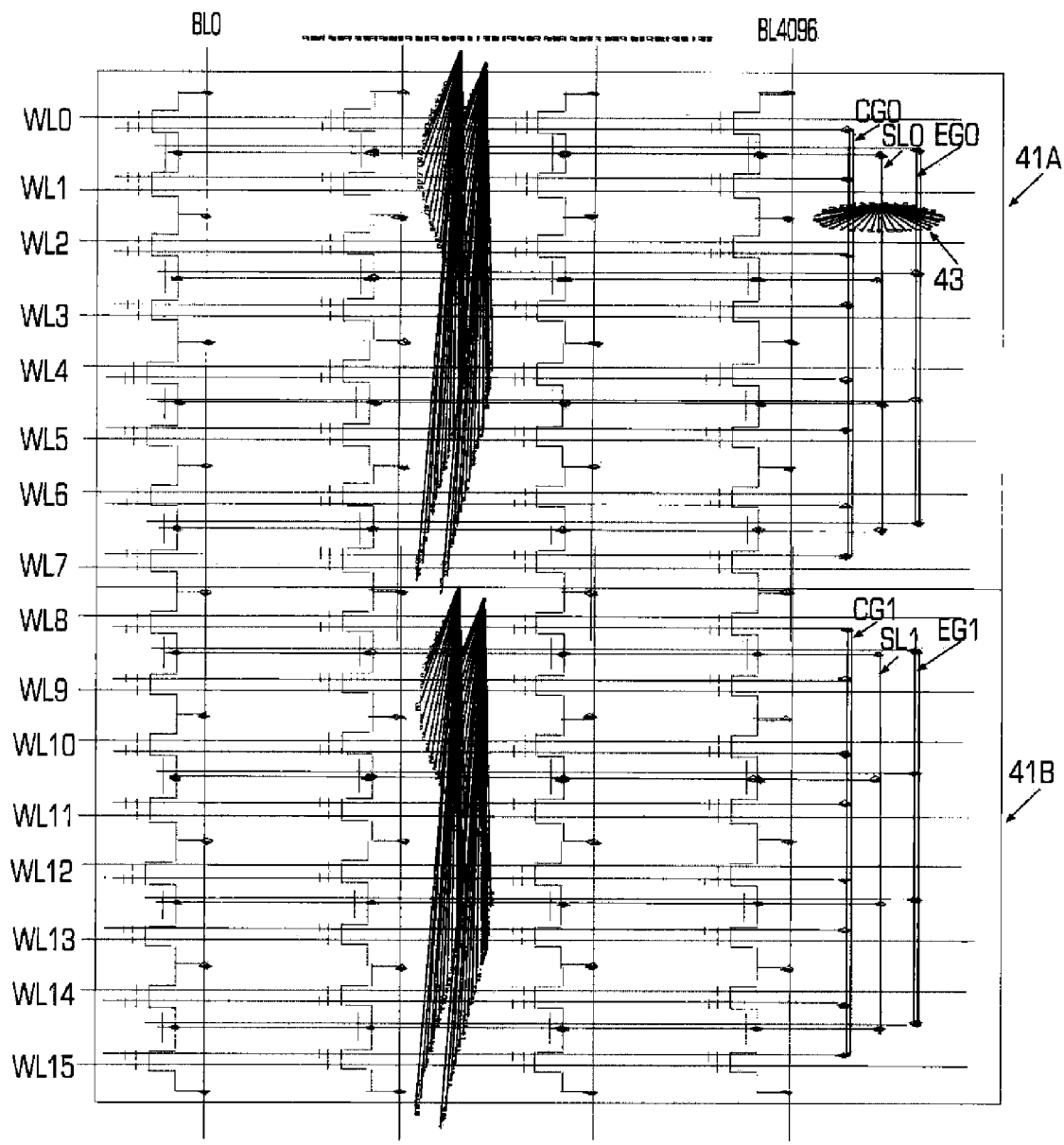
FIG. 1C is a schematic circuit diagram of the non-volatile memory array of the prior art shown in FIG. 1B.
Figure 2:
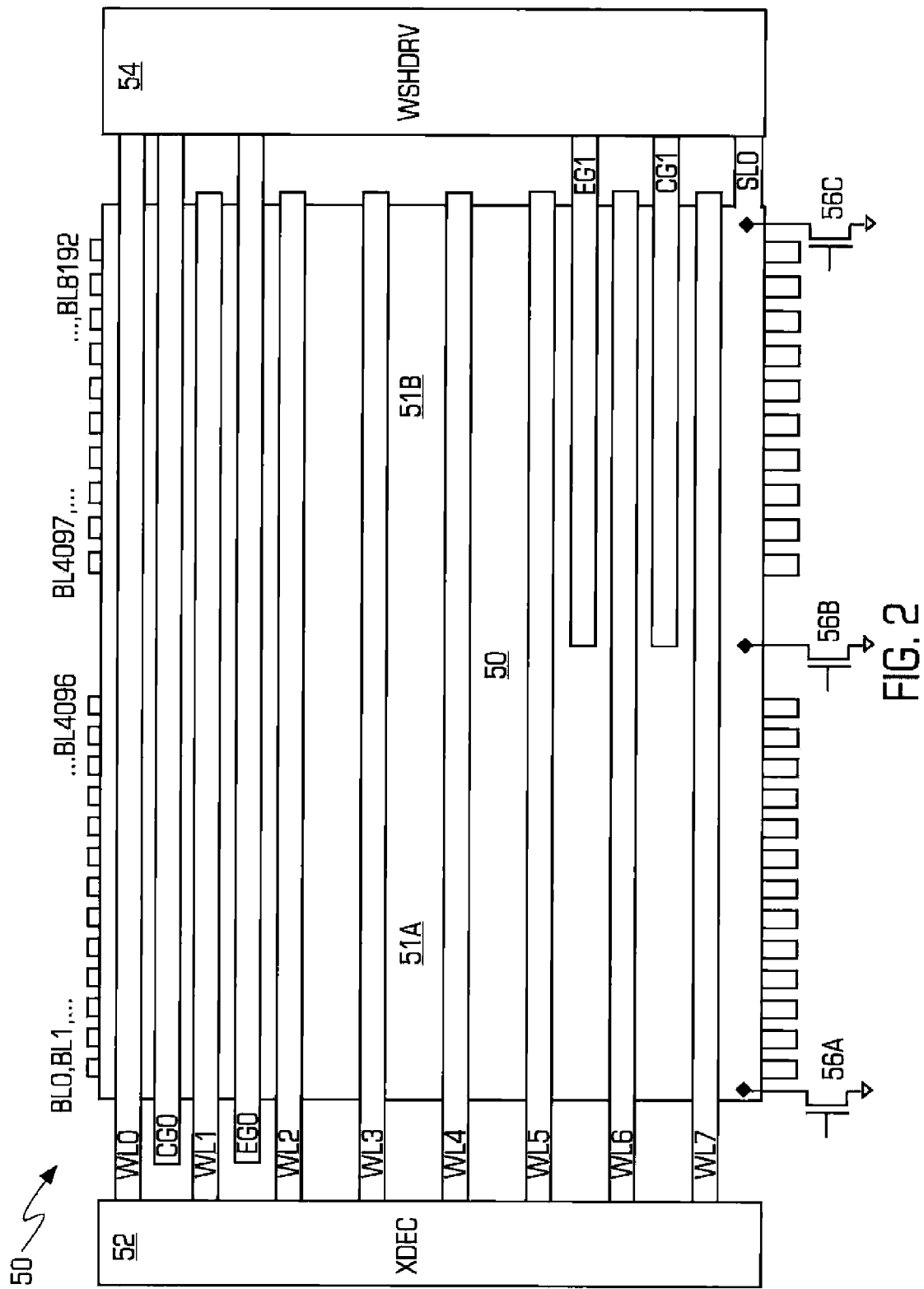
FIG. 2 is a top view of a first embodiment of a non-volatile memory array of the present invention, using the non-volatile memory cell of FIG. 1.

Referring to FIG. 2 there is shown a top view of a first embodiment of a non-volatile memory array and pitch 50 of the present invention using as an example, the non-volatile memory cell 10 shown in FIG. 1. A memory array 50 has a plurality of the memory cells 10 arranged in a plurality of rows and columns. Memory cells 10 in the same column share a common bit line connected to the first region 14. Memory cells 10 in the same row are connected to the same word line 20, which connects to the word gate 20 of the memory cells, in that row. Further, memory cells 10 in the same row are connected to the same control gate line, which connects to the control gate 24 of the memory cells 10 in that row. In addition, memory cells 10 in the same row are connected to the same erase gate line 26, which is connected to the erase gate 26 of the memory cells in that row. Finally, memory cells 10 in the same row are connected to the source line 16, which is connected to the source region 16 of the memory cells 10 in that row.

As shown in FIG. 2, the array 50 consists of 8 rows and 8192 (8K) bitlines making up a total of 8K bytes that consists of two sub-arrays 51A and 51B, each being a 4 KB sector. The first 4 KB sector 51A includes 8 rows and 4K bitline (BL0-4096) and the second 4 KB sector 51B includes the same 8 rows and 4K bitlines from BL4097 to BL8192. In the array and pitch 50 a first decoder 52 is located to one side of the sub-array 51A, and a second decoder 54 is located on the other side of the sub-array 51B. The first and second decoders 52 and 54 are aligned with the array 50 in the row direction. The first decoder 52 is typically a low voltage decoder. Thus, the first decoder 52 is connected to elements that require low voltage, such as the word line 20 and the control gate line 24. The second decoder 54 is a high voltage decoder, and is connected to elements that require high voltage to be supplied thereto, such as the source line 16 and the erase gate line 26.

To minimize the effect of programming the first sector 51A disturbing on the second sector 51B (or vice versa), a separate control gate is provided for each sector, CG0 for BL0-4096 and CG1 for BL4097-8192. Not shown is vertical metal strap connecting all 8 poly control gates 24 of the first sector 51A to only CG0 and the vertical metal strap connecting all 8 poly control gates 24 of the second sector 51B to only CG1. To separately erase the two sectors, two separate erase lines, EG0 for BL0-4096 and EG1 for BL4097-8192 are provided. Not shown is vertical metal strap connecting all 4 poly erase gates 26 of the first sector 51A to only EG0 and the vertical metal strap connecting all 4 poly erase gates 26 of the second sector 51B to only EG1. Hence the pitch decoder overhead is reduced since the decoder 52 is shared for 8K bitlines and the decoder 54 is also shared for 8K bitlines with some small additional decoder for second control gate CG1 and second erase gate EG1. Transistors 56A, 56B, and 56C are used to pull down to a ground level the source line SL0.

Figure 2B:
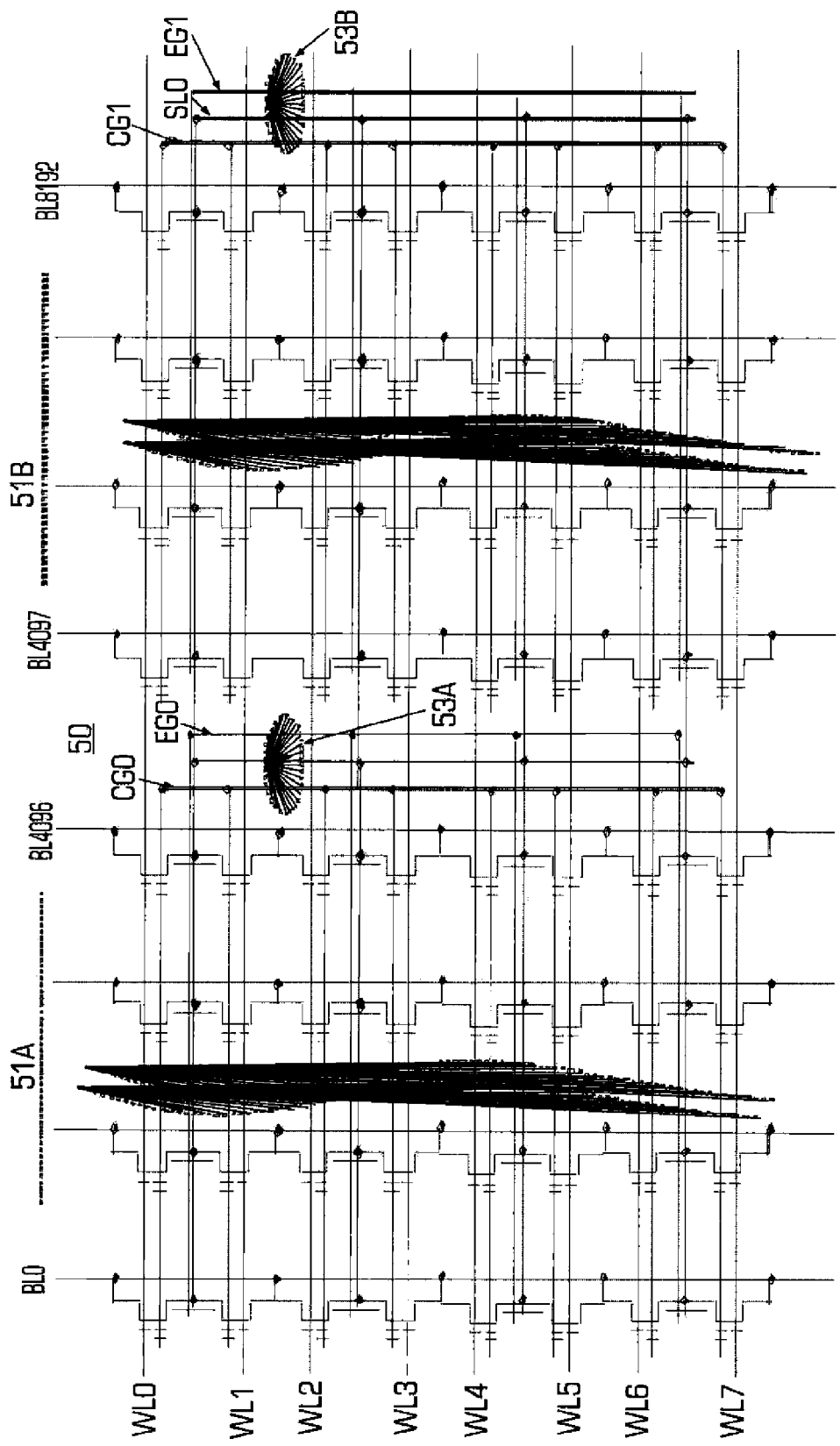
FIG. 2B is a schematic circuit diagram of the non-volatile memory array shown in FIG. 2.

Referring to FIG. 2B there is shown a schematic circuit diagram of the non-volatile memory array 50 shown in FIG. 2. As shown symbolically is a schematic of the memory array 50 shown in FIG. 2 that consists of 8 rows and 8K bitlines making up two 4 KB array sector 51A and 51B side by side horizontally. The first 4 KB sector 51A thus consists of WL0-7, CG0, SL0, and EG0. The second 4 KB sector 51B thus consists of WL0-7, CG1, SL0, and EG1. Top (horizontal) metal strapping layers are not shown for clarification purpose. Vertical metal strap line 53A or 53B is shown per sector for connecting 4 poly erase gates into one EG, 4 diffusion source lines into one SL, 8 poly control gates into one CG (not shown for WL). Strap for EG, SL, CG is shown to be next to each other at one physical place. Alternatively any strapping combination of terminals EG, SL, CG can be done at different physical location. Strapping frequency (how often the top metal connect through via to poly or diffusion layer of memory cells) is not shown. Typically strapping frequency for SL or WL is per 8, 16, 32 memory cells and for EG or CG is less frequent than that of SL or WL.

Figure 3:
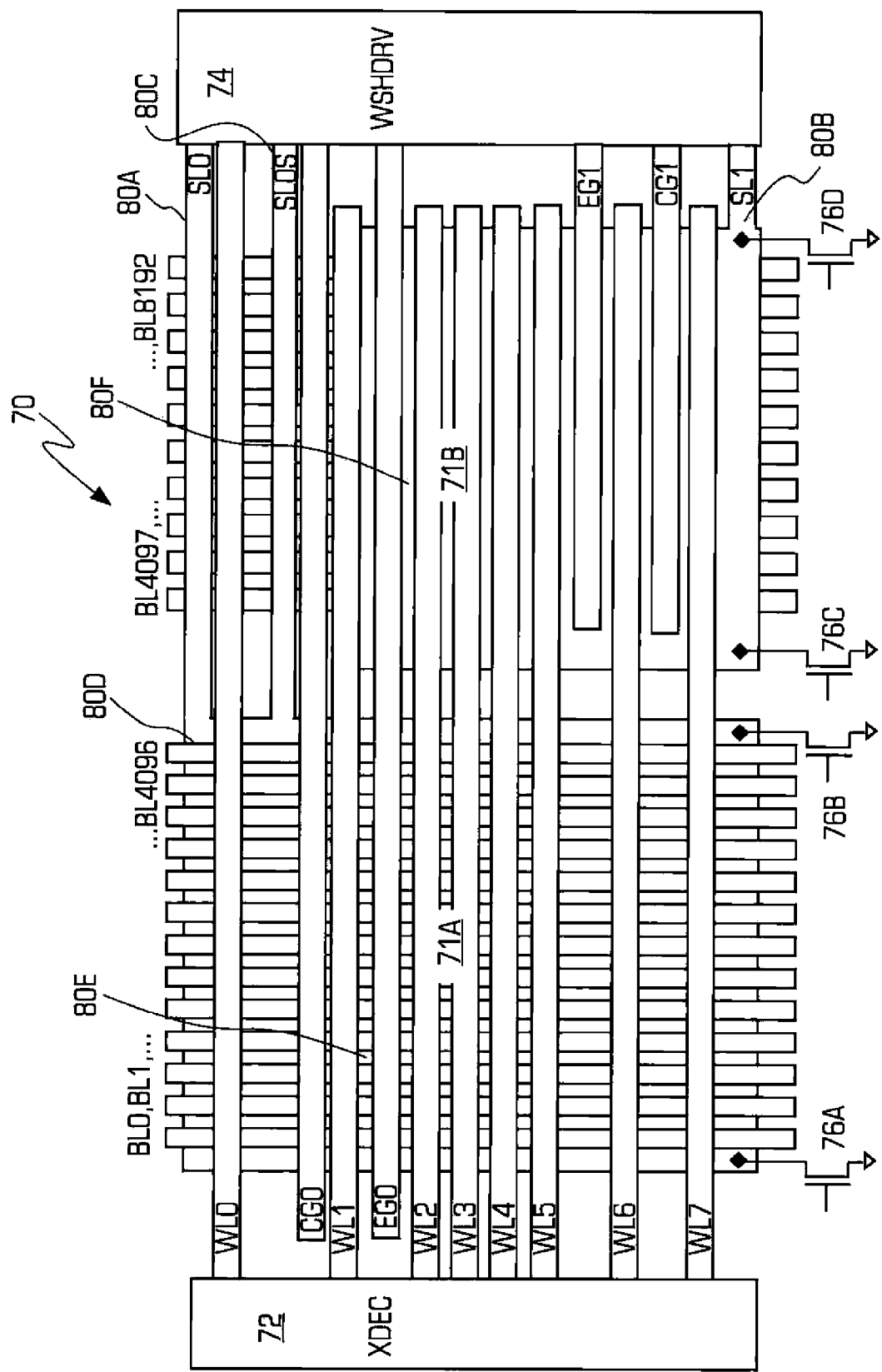
FIG. 3 is a top view of a second embodiment of a memory array of the present invention.

Referring to FIG. 3 there is shown a second embodiment of an array and pitch 70 of the present invention. An array 70 comprises two sub-arrays 71A and 71B arranged side by side in a row direction. A first decoder 72 is located to one side of the first sub-array 71A. A second decoder 74 is located to another side of the sub-array 71B. The first decoder 72 is to decode and supply low voltages to the memory cells in the array 71. The second decoder 74 decodes and supplies high voltages to the memory cells in the array 71. In the array and pitch 70 of the present invention, the array 70 is divided physically into two sub-arrays 71A and 71B, albeit they are side-by-side in the row direction.

In the embodiment shown in FIG. 3, a separate source line, i.e. SL0 (provided at the "top" of the second decoder 74) and SL1 (provided at the "bottom" of the second decoder 74), is provided for each of the two 4 KB sectors 71A and 71B. This is done to avoid disturbing an unselected sector (such as the right sector 71B) by the high voltage on the source line from the other sector, the selected sector (such as the left sector 71A) during programming. The source line SL0 connects only to the source lines, such as 80A, 80C, 80E, for the 4 KB sector 71A on the left (made up of 8 rows and bitline BL0-BL4096) and the source line SL1 connects only to the source lines, such as 80B and 80F for the 4 KB sector 71B on the right (made up of the same 8 rows and bitlines BL4097-BL8192). These 8 rows share the same wordlines WL0-7 but have different EGs (EG0 on left sector 71A and EG1 on right sector 71B) and different CGs (CG0 on left sector 71A and CG1 on right sector 71B).

Similarly the CG lines are separate (CG0 on left sector 71A and CG1 on right sector 71B) to avoid the high voltage on the control gate in one selected sector (such as the left sector 71A) from disturbing the unselected sector during programming (such as the right sector 71B). Because the high voltage source lines are the "critical" lines to experience voltage drops due to their carrying the cell programming current (critical since the voltage on the source lines needs to be controlled accurately across the array for accurate programming multiple cells across the array), in the array 70, the wide line 80E requiring high voltages to be supplied to the sub-array 71A is connected directly to the second decoder 74 through a relatively small narrow line. 80A and line 80C. The purpose of the line 80A is to deliver a high voltage into the node SLE 80D. Since the line 80E (also line 80F) is wide (covering roughly 8 row heights) the voltage drop across this line is insignificant. As will be discussed, the purpose of the line 80C SL0S is to sense the node 80D SL0E and feeding back into a control loop circuitry to control the line 80A to maintain an accurate bias voltage at the node SLE 80D (called drive-and-feedback programming scheme). Thus, for example, the high voltage lines SL0, CG0, EG0 connects directly from the second decoder 74 to the source region 16 through line 80A and 80E, the control gate 24, and the erase gate 26 of the memory cells in the sub-array 71A. The high voltage line SL1, CG1, EG1 connects directly from the second decoder 74 to the source region 16 through line 80B and 80F, the control gate 24, and the erase gate 26 of the memory cells in the sub-array 71B. Both sub-arrays 71A and 71B share the same WL0-7. In this manner, each of the lines supplying the high voltages to the sub-arrays 71A and 71B are connected to only one half of the memory cells. In that event, the voltage drop for the lines supplying the high voltages to the sub-arrays 71A and 71B is much less than the voltage drops supplying the high voltages in the array and pitch 70. Transistors 76A and 70B are used to pull down to ground the SL 80E of the left sector and transistors 76C and 76D are used to pull down to ground the SL 80F of the right sector.

Although the embodiment shown in FIG. 3 shows the lines supplying the high voltages to the sub-array 71A are next to the sub-array 71B, in practice the electrical lines that carry the high voltages from the second decoder 74 to the sub-array 71A are made of metal and would be placed "over" or "on top" of the sub-array 71B. Thus, the placement of the lines as being adjacent and co-planar with respect to the sub-array 71B is for illustration purpose only.

The embodiment shown in FIG. 3 also shows the low voltage lines being connected from the first decoder 72 to the memory cells 10 in the sub-array 71A and then to the memory cells 10 in the sub-array 71B. However, it should be clear to one of ordinary skill in the art, that similarly, the low voltage lines can be connected directly to the elements in the sub-array 71A, such as word line 20, and then a separate low voltage line is connected directly to the low voltage elements in the sub-array 71B.

Figure 3B:
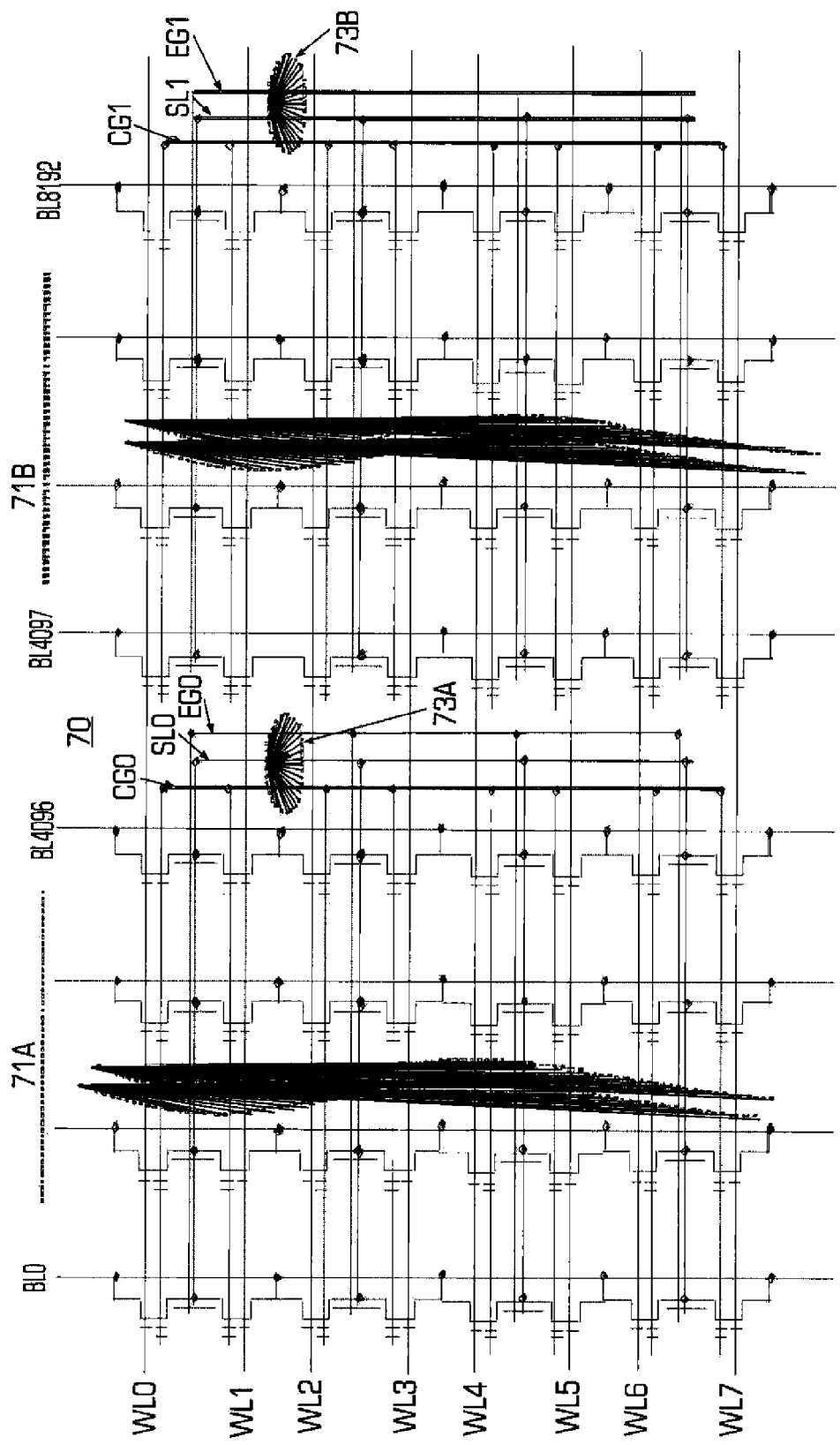
FIG. 3B is a schematic circuit diagram of the non-volatile memory array shown in FIG. 3.

Referring to FIG. 3B there is shown a schematic circuit diagram of the non-volatile memory array 70 shown in FIG. 3. As shown symbolically is a schematic of the memory array 70 shown in FIG. 3 that consists of 8 rows and 8K bitlines making up two 4 KB array sector 71A and 71B side by side horizontally. The first 4 KB sector 71A thus consists of 8 WL0-7, 1 CG0, 1 SL0, and 1 EG0. The second 4 KB sector 71B thus consists of 8 WL0-7, 1 CG1, 1 SL1, and 1 EG1. Top (horizontal) metal strapping layers are not shown for clarification purpose. Vertical metal strap line 73A or 73B is shown per sector for connecting 4 poly erase gates into one EG, 4 diffusion source lines into one SL, 8 poly control gates into one CG (not shown for WL). Strap for EG, SL, CG is shown to be next to each other at one physical place. Alternatively any strapping combination of terminals EG, SL, CG can be done at different physical location. Strapping frequency (how often the top metal connect through via to poly or diffusion layer of memory cells) is not shown. Typically strapping frequency for SL or WL is per 8, 16, 32 memory cells and for EG or CG is less frequent than that of SL or WL.

Figure 4:
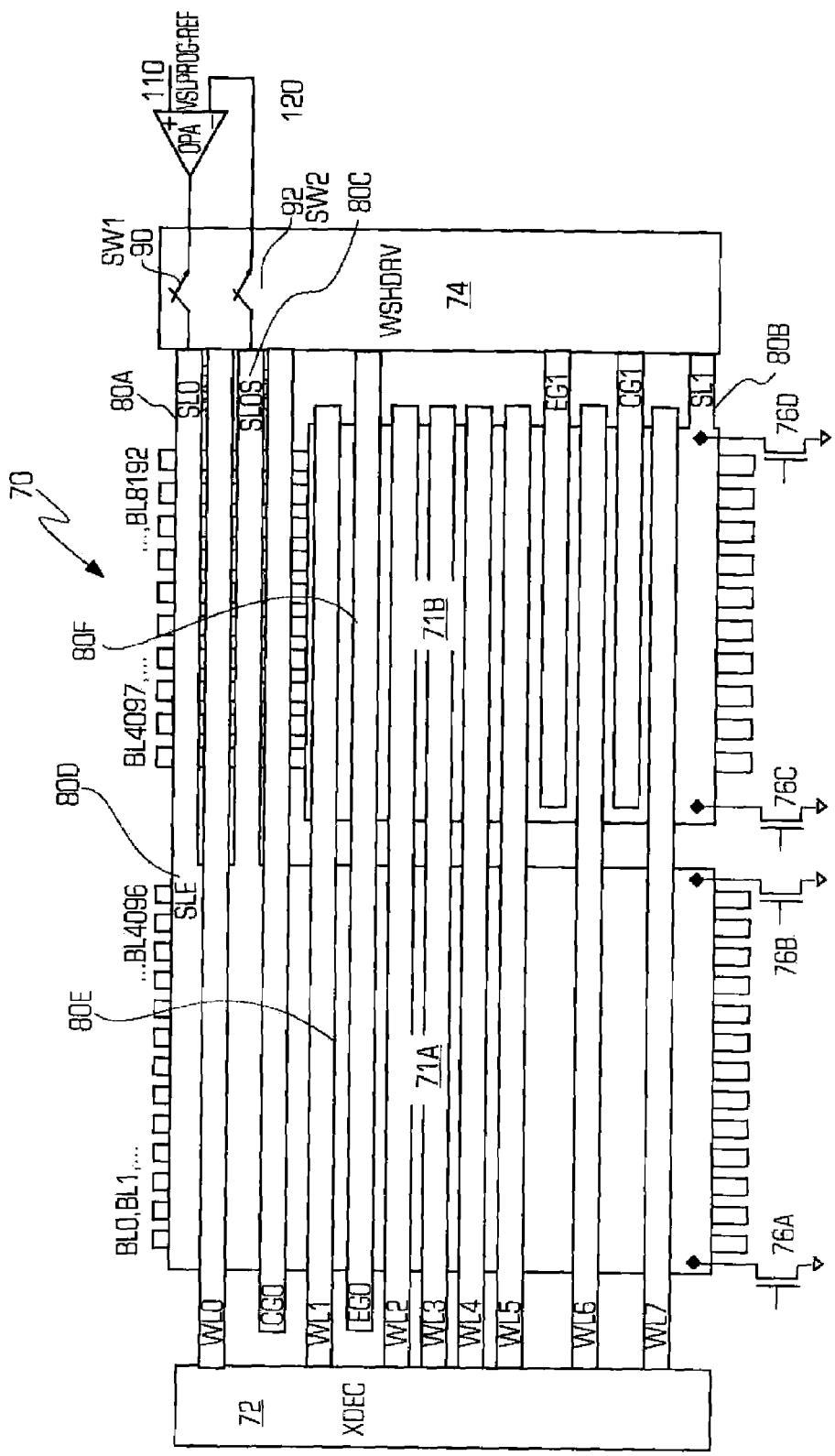
FIG. 4 is a top view of a third embodiment of a memory array of the present invention.

Referring to FIG. 4 there is shown a top view of a third embodiment of the memory array and pitch 70 of the present invention with a control loop circuitry to illustrate the drive-and-feedback programming scheme. As shown, an operational amplifier OPA 100 is used to drive a high voltage through a switch SW0 90 to the source line 80A. The source line 80A is connected to the source region of the memory cells 10 in the sub-array 71A. The source line 80C from the sub-array 71A is connected through a switch SW2 92 to the negative terminal 120 of the OPA 100. A bias high voltage VSLPROG-REF 110 is applied to the positive terminal of the OPA 100. By the action of the operational amplifier 100, the exact voltage level of the bias high voltage VSLPROG-REF 110 will be imposed on the node SLE 80D, which in turns transfer to the line 80E. Hence the voltage drop across the line is SL0 80A does not impact the exact level on the line 80E.

Figure 5:
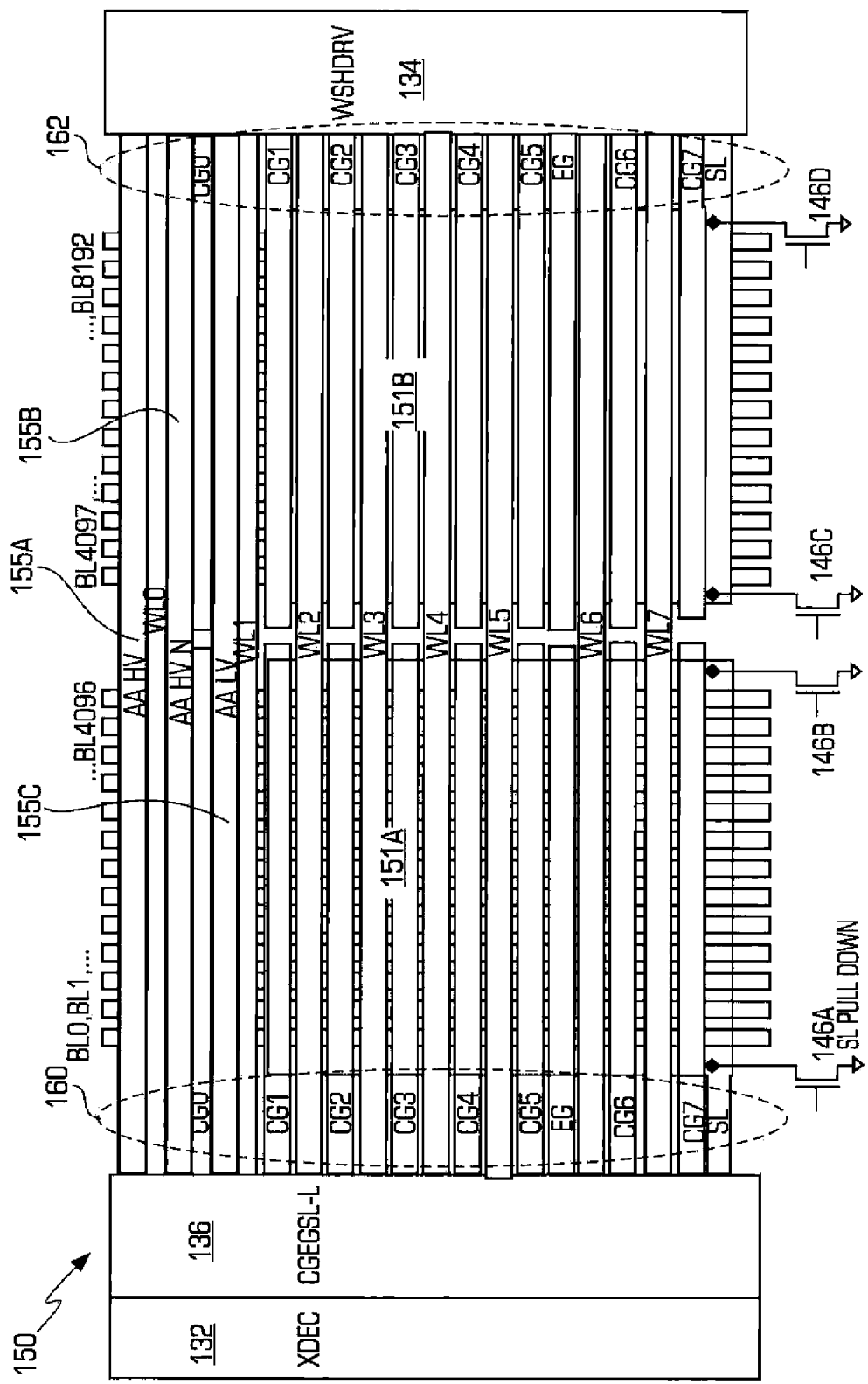
FIG. 5 is a top view of a fourth embodiment of a memory array of the present invention.

Referring to FIG. 5 there is shown a fourth embodiment of an array and pitch 150 of the present invention. As shown there are two array 151A for the left sector (8 rows and 4K bitlines BL0-4096) and 151B for the tight sector (8 rows and 4K bitlines BLA097-8192). Decoder 132 is similar to the decoder 52 of FIG. 2, providing decoding for W0-7 which is connected to the sectors 151A and 151B. However decoder 134 is now providing decoding lines 162 (8 CG0-7 (instead of 4 CGs), 1 EG, 1 SL) for the right sector only. In addition it provides pre-decoded lines AAHV 155A (high voltage pre-decoding line for a sector), AAHVN 155B (high voltage complementary pre-decoding line for a sector, AALV 155C (low voltage pre-decoding line for a sector). Alternatively different number of pre-decoded lines can be implemented, such as no AAHVN 155B line. Alternatively only high voltage pre-decoded lines can be provided (no low voltage pre-decoded lines). In this case low voltage pre-decoding function can be locally generated from the high voltage pre-decoded line (such as using inverter 254B and transistor 254A in circuit 254 in FIG. 9). Decoder 136 provides decoding lines 160 (8 CG0-7, 1 EG, 1 SL) for the left sector 151A. The decoder 136 has its input the pre-decoded lines 155A, 155B, 155C. This embodiment is advantageous in terms of minimizing the disturbance since all high voltage lines are separated for left sector 151A and right sector 151B. However, this embodiment requires additional decoding circuitry (the decoder 136) and associate decoded lines. The decoder 132 and the pre-decoder circuitry (that generates pre-decoded lines 155A, 155B, 155C) are common to both of the sectors 151A and 151B for less decoder overhead.

Figure 6:
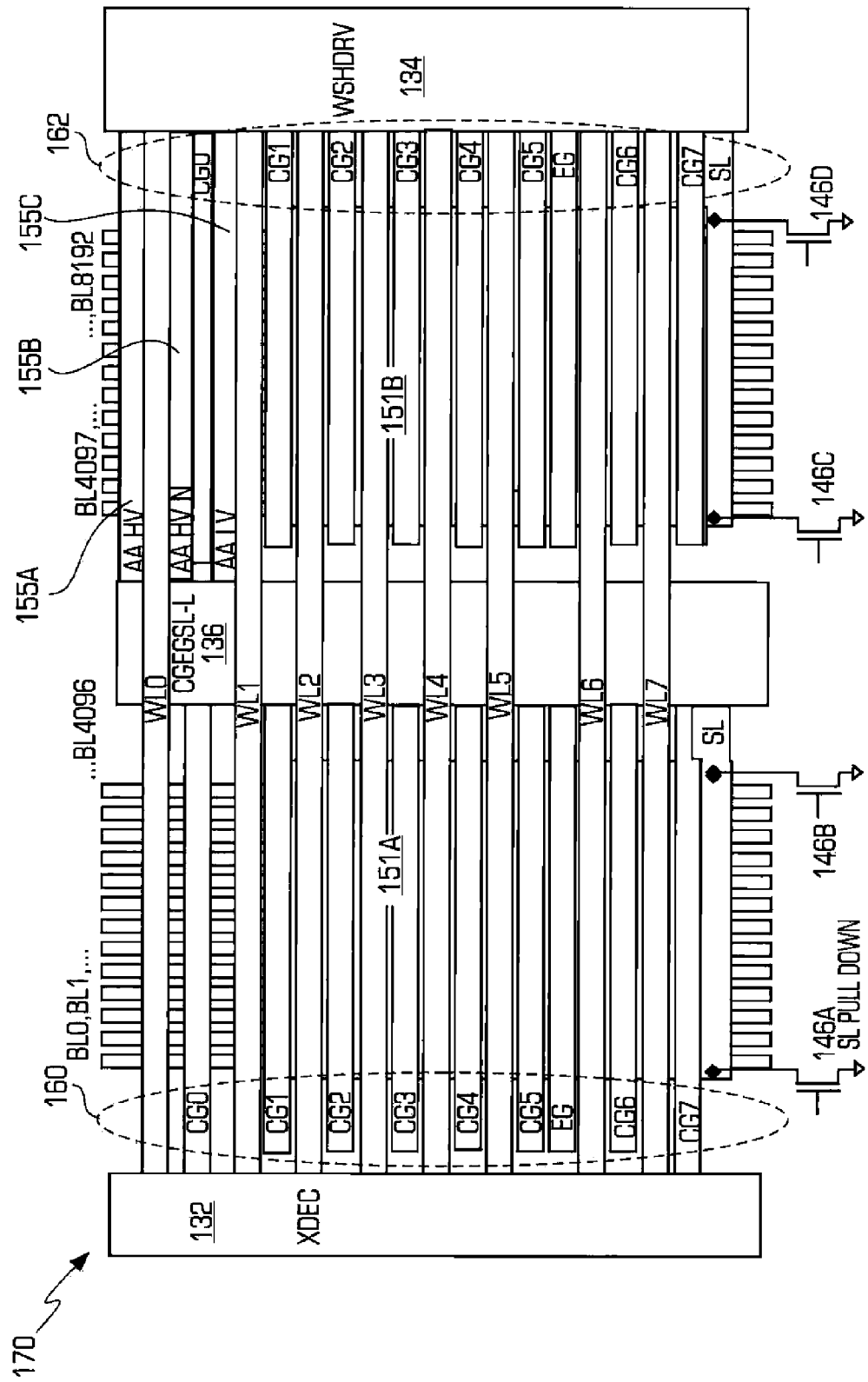
FIG. 6 is a top view of fifth embodiment of a memory array of the present invention.

Referring to FIG. 6 there is shown a fifth embodiment of an array and pitch 170 of the present invention. This array and pitch 170 of the present invention is similar to that of array and pitch 150 with the decoder 136 placed in between the array 151A and 151B. Alternatively the decoder 136 can be placed next the decoder 132. In this case the lines 155A, 155B, 155C only run across the array 151B but not 151A. Thus, in this embodiment, the decoder 134 supplies partially decoded address signals to the decoder 136. The decoder 136 is connected only to the source line SL which connects to the sub array 151A, while the decoder 134 is connected only to the source line SL which connects to the sub array 151B. In addition, the decoder 136 is connected only to the control gate CG lines (CG0-CG7) connected to the sub-array 151A, while the decoder 134 is connected only to the control gate CG lines (CG0-CG7) connected to the sub-array 151B. Finally, the decoder 136 is connected only to the erase gate line EG which connects to the sub array 151A, while the decoder 134 is connected only to the erase gate line EG which connects to the sub array 151B. The word lines (WL0-WL7) are connected to the decoder 132 and are connected to both of the sub arrays 151A and 151B.

Figure 7:
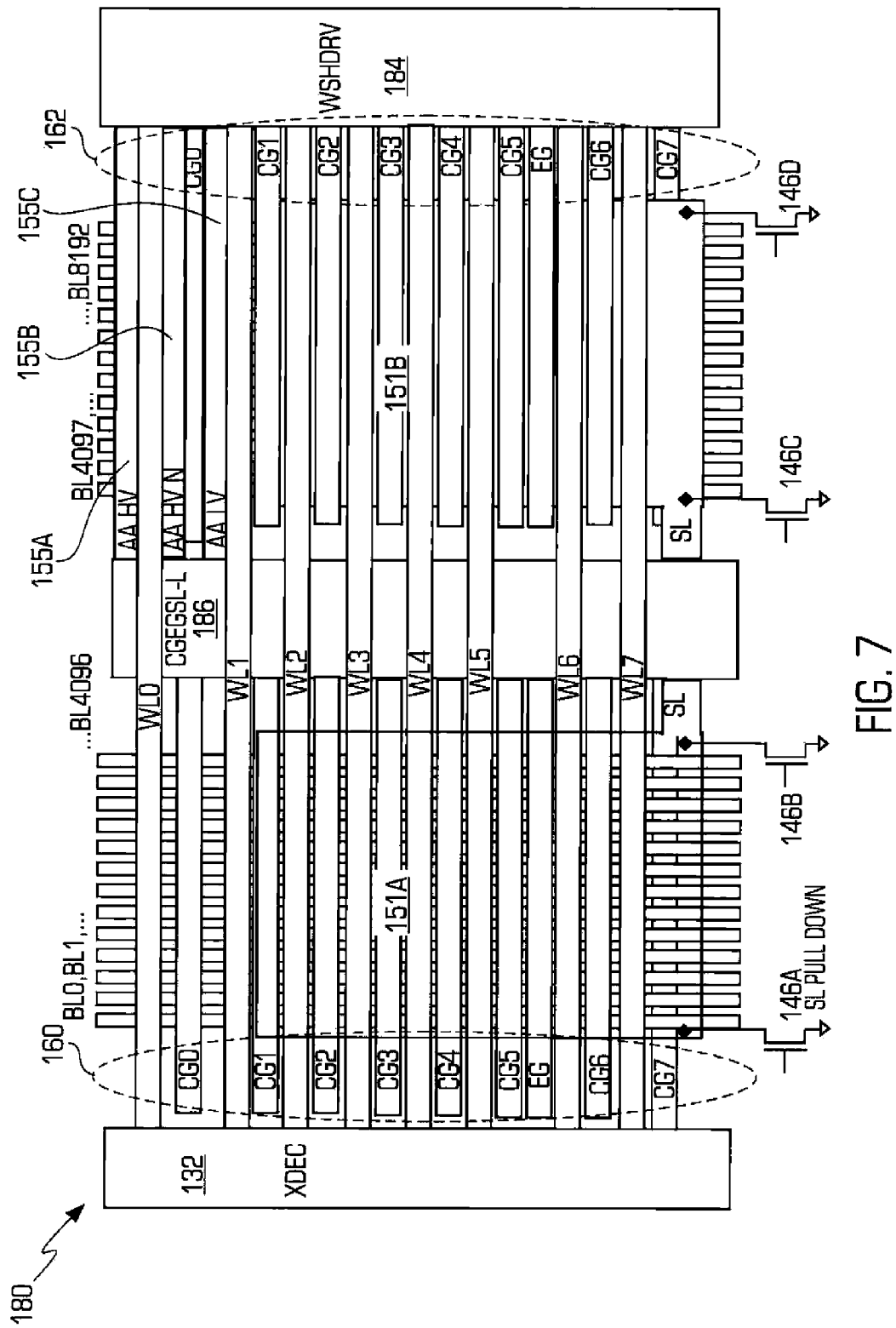
FIG. 7 is a top view of sixth embodiment of a memory array of the present invention.

Referring to FIG. 7 there is shown a sixth embodiment of an array and pitch 180 of the present invention. This array and pitch 180 of the present invention is similar to that of array and pitch 170 with a decoder 186 placed in between the array 151A and 151B. The decoder 186 now provides both decoding lines 160 and 162 (all CGs, EGs, SLs for both sectors) from the middle of the array 151A and 151B. The decoder 184 only provides pre-decoded line 155A, 155B, 155C. Thus, the decoder 184 provides partially decoded address signals to the decoder 186. The decoder 186 is connected to the source line SL of the sub arrays 151A and 151B. In addition, the decoder 186 is connected to the control gate CG lines (CG0-CG7) connected to the sub-arrays 151A and 151B. Finally, the decoder 186 is connected to the erase gate line EG which connects to the sub arrays 151A and 151B. The word lines (WL0-WL7) are connected to the decoder 132 and are connected to both of the sub arrays 151A and 151B.

Alternatively the decoder 184 can be placed next to the decoder 186 in between arrays 151A and 151B.

Figure 8:
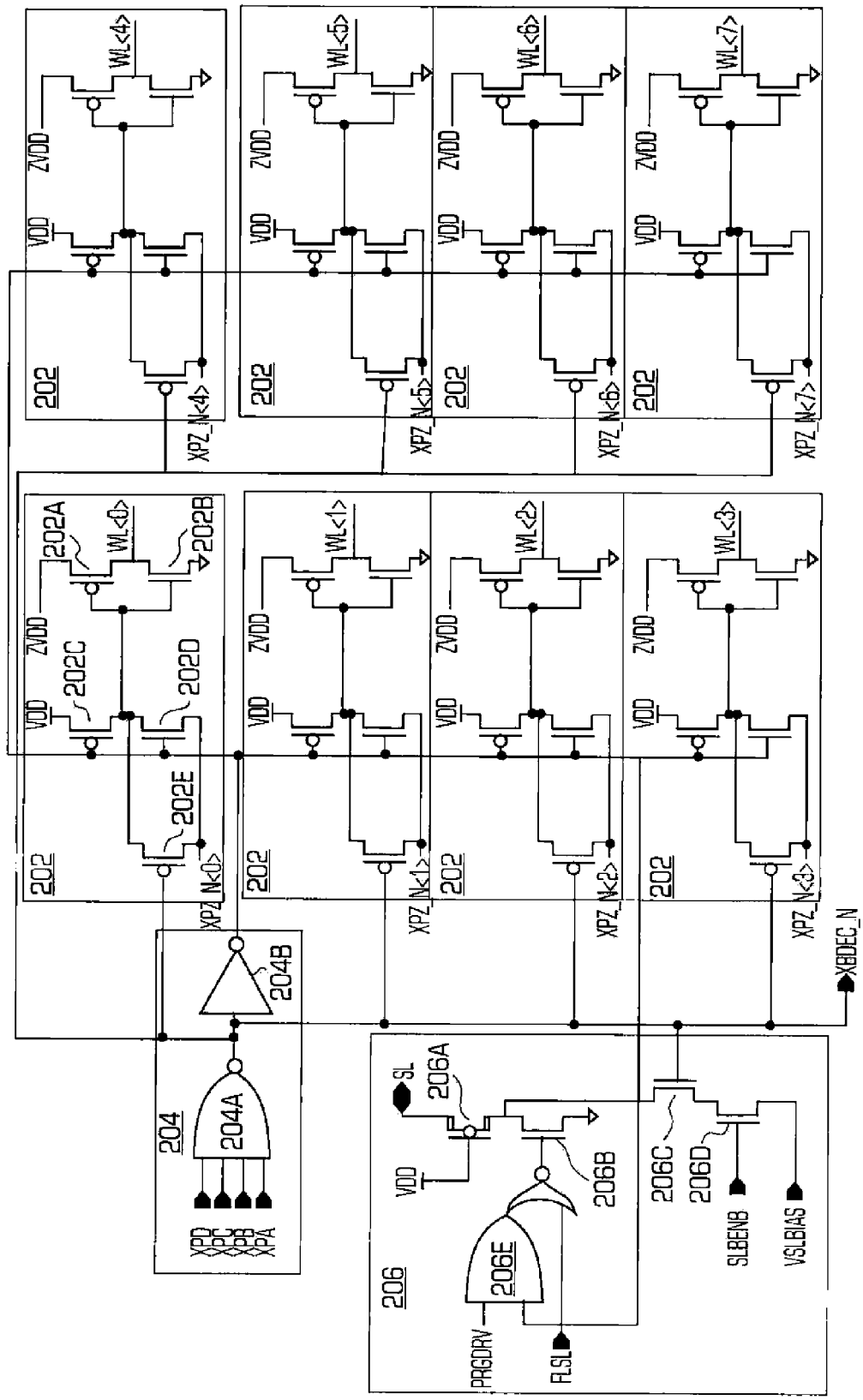
FIG. 8 is a first embodiment of a memory array decoder of the present invention.

Referring to FIG. 8 there is shown a first embodiment of a decoder that can be used in low voltage decoder 42, 52, 72, or 132. Circuit 202 is used to select individual wordline in a selected sector (one of 8 wordline WL0-7) to either a high voltage level ZVDD (e.g., 0.5-2.5V) or a low voltage level (e.g. ground level). The circuit 202 includes PMOS transistor 202A and NMOS transistor 202B as a driver and PMOS transistor 202C and 202E and NMOS transistor 202D as pre-driver having pre-decoding address signals as inputs. The circuit 202 can also be used to drive in a high speed fashion the selected wordline such as in read. Circuit 204, consisting of NAND gate 204A and inverter INV 204B, is used for decoding individual sector (sector selection). Circuit 206 is used to pull the source line SL to ground (such as in read) through NMOS transistor 206A and 206B or a bias level (such as in programming inhibit) through NMOS transistors 206C and 206D.

Figure 9:
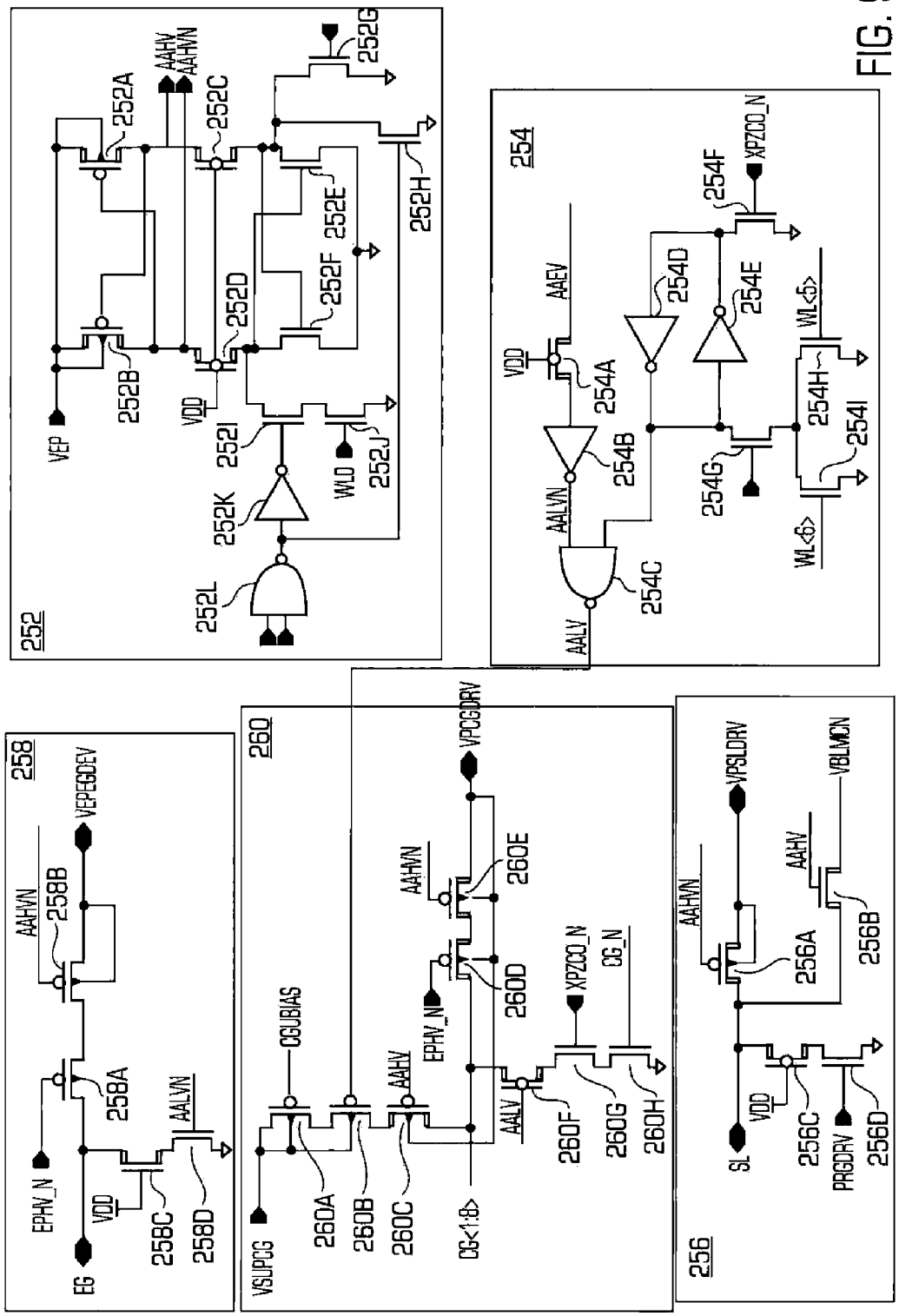
FIG. 9 is a second embodiment of a memory array decoder of the present invention.

Referring to FIG. 9 there is shown a second embodiment of a decoder that can be used to implement the high voltage decoder 44, 54, 74, or 134. Circuit 252 is a high voltage latch that latches the sector decoding information from WL0 after being reset appropriately by signals EPSET, DISCG_N, EPRESET. It provides pre-decoding high voltage sector signal AAHV, AAHVN. The circuit 252 includes HV (high voltage) PMOS 252A and 252B and HV NMOS 252(C-F) cross-coupled acting as a high voltage latch with NMOS 252C-D as high voltage buffering (cascoding) transistors. The circuit 252 includes NAND 252L, INV 252K, NMOS transistors 252(G-J) to control setting and resetting the HV latch. Circuit 254 is a low voltage latch circuit that latches the sector decoding information from WL0 and WL5 and SETBCG after being reset appropriately by signals RSTBCG. The circuit 254 is used to disable the bad row (bad CG or bad EG) such as to avoid standby current from bad row. The circuit 254 includes cross-coupled inverters INV 254D and 254E acting as a low voltage latch. The circuit 254 includes NMOS transistors 254(F-I) to control setting and resetting the low voltage latch. The circuit 252 together with circuit 254 provides the low voltage sector decoding signal AALV and AALVN. HV NMOS transistor 254A acts as high voltage buffering for the signal AAHV before it goes into the inverter 254B (providing the signal AALVN) and NAND gate 254C (providing the signal AALV).

Circuit 256 provides SL decoding. HV PMOS transistor 256A provides driving SL signal and HV NMOS transistor 256B provides information for SL feedback. These function similarly to the switches 90 and 92 in FIG. 4 respectively. The circuit 256 includes HV NMOS 256C and LV NMOS 256D acting to pull-down the source line SL to ground such as during read or erase.

Circuit 258 provides EG decoding. HV PMOS transistor 258A serves both as timing control and a bias control to limit current to erase gate (erase gate current limiter) such as to control standby current for defective erase gate. HV PMOS transistor 258B is to enable a high voltage into the erase gate EG. HV NMOS transistor 258C and LV NMOS 258D is to pull the EG to the ground such as in de-selection (not selected). The PMOS transistor 258A acts as a current limiter to limit the amount of current flowing therethrough in the event of a "short" from the erase gate to ground.

Circuit 260 provides CG decoding. LV PMOS transistors 260A and HV PMOS 260D serves to limit current in standby and in program respectively (control gate current limiter) such as to control standby current for defective control gate. IV PMOS 260E is to enable high voltage (such as during programming) into the control gate CG. LV PMOS 260B and HV PMOS 260C are to enable low voltage (such as during read or standby) into the control gate CG. HV NMOS 260F and LV NMOS 260G-H are used to pull down the control gate CG to ground such as during de-selection. The circuit 260 can be modified to decode 8 CG (instead 2 as shown) such as for FIG. 5, 6, or 7. The circuits 256, 258, and 260 can be used to implement the circuit 132 in FIG. 6 or 7. The LV PMOS transistor 260A acts as a current mirror (its gate is not connected to ground but instead to a bias level). Thus, in a read mode, PMOS transistor 260A limits the current flow from VSUPCG through transistors 260A, 260B and 260C to control gate CG. In a programming mode, PMOS transistor 260D acts as a current mirror (its gate is not connected to ground but instead to a bias level). During programming current flows from VPCGDRV through transistors 260E and 260D to the Control Gates CG. The current limiting function of transistors 260A and 260D during read and program operations, respectively, serve to limit the current in the event of a "short" from a "bad" control gate to ground.

In the embodiments describe herein there is only two sub-arrays shown in FIGS. 3,4,5,6,7. Alternative embodiments having more than two sub arrays are possible with additional circuitry.

What is claimed is:

1. An array of non-volatile memory cells arranged in a plurality of rows and columns, wherein each memory cell is formed in a semiconductor substrate of a first conductivity type, with a first region of a second conductivity type along the surface of the substrate, a second region of the second conductivity type along the surface of the substrate, spaced apart from the first region defining a channel region therebetween, a floating gate over a portion of the channel region, a coupling gate over the floating gate, a word gate over another portion of the channel region and adjacent to and separated from the floating gate, and an erase gate over the second region adjacent to and separated from the floating gate, wherein cells in the same column have a common bit line connected to the first regions of memory cells in the same column, said array comprising:

a first and second sub arrays of memory cells arranged adjacent to one another in the same row;

a first decoder to one side of the first sub array in the same row as the first sub array;

a second decoder to another side of the second sub array in the same row as said second sub array;

a first coupling gate line connected to the second decoder and to only the coupling gate of the memory cells in the first sub array;

a second coupling gate line, different from the first coupling gate line, connected to the second decoder and to only the coupling gate of the memory cells in the second sub array;

a word line connected to the first decoder and to the word gate of the memory cells of said first and second sub arrays;

a first erase gate line connected to the second decoder and to only the erase gate of the memory cells of said first sub array; and a second erase gate line connected to the second decoder and to only the erase gate of the memory cells of said second sub array.

2. The array of claim 1 further comprising:
a first source line connected to the second decoder and to only the second region of the memory cells in the first sub array;
a second source line, different from the first source line, connected to the second decoder and to only the second region of the memory cells in the second sub array.

3. The array of claim 2 further comprising:
A control loop circuit connected to the first source line through the second decoder for supplying a high voltage to the first source line.

4. The array of claim 3 further comprising a third source line connected only to the second region of memory cells only in the first sub-array for detecting a detected voltage of said second region of memory cells in the first sub-array and for supplying said detected voltage to said control loop circuit.

5. The array of claim 1 further comprising:
a source line connected to the second decoder and to the second region of memory cells in the first and second sub arrays.

6. The array of claim 1 wherein said second decoder supplies high voltage to said erase gate and said coupling gate lines.

7. The array of claim 6 wherein said second decoder further comprising first current limiting means for limiting current flowing to said first coupling gate line, and for limiting current flowing to said second coupling gate line.

8. The array of claim 7 wherein said second decoder further comprising current limiting means for limiting current flowing to said first erase gate line, and for limiting current flowing to said second erase gate line.

9. An array of non-volatile memory cells arranged in a plurality of rows and columns, wherein each memory cell has at least three terminals: a first terminal for the read out of the signal from the memory cell, a second terminal to which high voltage is supplied during certain operation, and a third terminal to which low voltage is supplied in all operations, wherein cells in the same column have a common bit line connected to the first terminal of memory cells in the same column, said array comprising:
a first and second sub arrays of memory cells arranged adjacent to one another in the same row;
a first decoder to one side of the first sub array in the same row as the first sub array;
a second decoder to another side of the second sub array in the same row as said second sub array;
a first high voltage line connected to the second decoder and to only the second terminal of the memory cells in the same row in the first sub array;
a second high voltage line, different from the first high voltage line, connected to the second decoder and to only the second terminal of the memory cells in the same row in the second sub array; and
a low voltage line connected to the first decoder and to the thirds terminal of the memory cells in the same row of said first and second sub arrays.

10. The array of claim 9 wherein said second decoder further comprising:
current limiting means for limiting current flow through said first high voltage line and through said second high voltage line.

11. An array of non-volatile memory cells arranged in a plurality of rows and columns, wherein each memory cell is formed in a semiconductor substrate of a first conductivity type, with a first region of a second conductivity type along the surface of the substrate, a second region of the second conductivity type along the surface of the substrate, spaced apart from the first region defining a channel region therebetween, a floating gate over a portion of the channel region, a coupling gate over the floating gate, a word gate over another portion of the channel region and adjacent to and separated from the floating gate, and an erase gate over the second region adjacent to and separated from the floating gate, wherein cells in the same column have a common bit line connected to the first regions of memory cells in the same column, said array comprising:
a first and second sub arrays of memory cells arranged in the same row;
a first decoder to one side of the first sub array in the same row as the first sub array;
a second decoder to another side of the second sub array in the same row as said second sub array;
a third decoder;
a first source line connected to the third decoder and to only the second region of the memory cells in the first sub array;
a second source line, different from the first source line, connected to the second decoder and to only the second region of the memory cells in the second sub array;
a first coupling gate line connected to the third decoder and to only the coupling gate of the memory cells in the first sub array;
a second coupling gate line, different from the first coupling gate line, connected to the second decoder and to only the coupling gate of the memory cells in the second sub array;
a word line connected to the first decoder and to the word gate of the memory cells of said first and second sub arrays;
a first erase gate line connected to the third decoder and to the erase gate of the memory cells of said first sub array; and
a second erase gate line connected to the second decoder and to the erase gate of the memory cells of said second sub array.

12. The array of claim 11 further comprising one or more signals lines connecting the second decoder to the third decoder for supplying partially decoded address signals to said third decoder.

13. The array of claim 12 wherein said third decoder is between the first decoder and the first sub array.

14. The array of claim 12 wherein said third decoder is between the first sub array and the second sub array.

15. The array of claim 12 wherein said second decoder supplies high voltage to said second source line, said second coupling gate line and said second erase gate line.

16. The array of claim 15 wherein said second decoder further comprising:
first current limiting means for limiting current flowing through said second coupling gate line; and
second current limiting means for limiting current flowing through said second erase gate line.

17. The array of claim 12 wherein said third decoder supplies high voltage to said first source line, said first coupling gate line and said first erase gate line.

18. The array of claim 17 wherein said third decoder further comprising:
first current limiting means for limiting current flowing through said second coupling gate line; and
second current limiting means for limiting current flowing through said second erase gate line.

19. An array of non-volatile memory cells arranged in a plurality of rows and columns, wherein each memory cell is formed in a semiconductor substrate of a first conductivity type, with a first region of a second conductivity type along the surface of the substrate, a second region of the second conductivity type along the surface of the substrate, spaced apart from the first region defining a channel region therebetween, a floating gate over a portion of the channel region, a coupling gate over the floating gate, a word gate over another portion of the channel region and adjacent to and separated from the floating gate, and an erase gate over the second region adjacent to and separated from the floating gate, wherein cells in the same column have a common bit line connected to the first regions of memory cells in the same column, said array comprising:
- a first and second sub arrays of memory cells arranged in the same row;
- a first decoder to one side of the first sub array in the same row as the first sub array;
- a second decoder;
- a third decoder between said first and second sub arrays;
- one or more signals lines connecting the second decoder to the third decoder for supplying partially decoded address signals to said third decoder;
- a first source line connected to the third decoder and to only the second region of the memory cells in the first sub array;
- a second source line connected to the second decoder and to only the second region of the memory cells in the second sub array;
- a first coupling gate line connected to the third decoder and to only the coupling gate of the memory cells in the first sub array;
- a second coupling gate line connected to the second decoder and to only the coupling gate of the memory cells in the second sub array;
- a word line connected to the first decoder and to the word gate of the memory cells of said first and second sub arrays;
- a first erase gate line connected to the third decoder and to the erase gate of the memory cells of said first sub array; and
- a second erase gate line connected to the second decoder and to the erase gate of the memory cells of said second sub array.

20. The array of claim 19 wherein said second decoder is to another side of the second sub array in the same row as the first sub array.

21. The array of claim 19 wherein said second decoder is between said third decoder and said second sub array.

22. The array of claim 19 wherein said second decoder further comprising:
- a first transistor for limiting current flowing through said second coupling gate line; and
- a second transistor for limiting current flowing through said second erase gate line.

23. An array of non-volatile memory cells arranged in a plurality of rows and columns, wherein each memory cell has at least three terminals: a first terminal for the read out of the signal from the memory cell, a second terminal to which high voltage: is supplied during certain operation, and a third terminal to which low voltage is supplied in all operations, wherein cells in the same column have a common bit line connected to the first terminal of memory cells in the same column, said array comprising:
- a first and second sub arrays of memory cells arranged adjacent to one another in the same row;
- a first decoder to one side of the first sub array in the same row as the first sub array and providing low voltage only to low voltage terminals of the memory cells;
- a second decoder to another side of the second sub array in the same row as said second sub array and providing high voltage only to high voltage terminals of to memory cells.

24. The array of claim 23 further comprising:
- a first high voltage line connected to the second decoder and to only to second terminal of the memory cells in the first sub array;
- a second high voltage line, different from the first high voltage line, connected to the second decoder and to only the second terminal of the memory cells in the second sub array.

25. The array of claim 24 further comprising:
- a low voltage line connected to the first decoder and to the third terminal of the memory cells of said first and second sub arrays.

26. The array of claim 23 wherein said second decoder further comprising:
- a current limiting transistor for limiting the current flowing through said second high voltage line.

27. An array of non-volatile memory cells arranged in a plurality of rows and columns, wherein each memory cell has at least three terminals: a first terminal for the read out of the signal from the memory cell, a second terminal to which high voltage is supplied during certain operation, and a third terminal to which low voltage is supplied in all operations, wherein cells in the same column have a common bit line connected to the first terminal of memory cells in the same column, said array comprising:
- a first and second sub arrays of memory cells arranged adjacent to one another in the same row;
- a first decoder to one side of the first sub array in the same row as the first sub array;
- a second decoder to another side of the second sub array in the same row as said second sub array; and
- a third decoder in between the first decoder and the second decoder, wherein said third decoder for receiving predecoded signals from said second decoder.

28. The array of claim 27 wherein said first decoder providing first decoded signals to memory cells in said first and said second sub arrays;
- wherein said second decoder providing second decoded signals only to said second sub array; and
- wherein said third decoder providing third decoded signals only to said third sub array.

29. The array of claim 28 wherein said first decoded signals are low voltage signals.

30. The array of claim 28 wherein said second decoded signals are low voltage signals and high voltage signals.

31. The array of claim 28 wherein said third decoded signals are only high voltage signals.

* * * * *